United States Patent
Shimojo

(10) Patent No.: US 10,249,639 B2
(45) Date of Patent: Apr. 2, 2019

(54) SEMICONDUCTOR MEMORY DEVICE

(71) Applicant: Toshiba Memory Corporation, Minato-ku (JP)

(72) Inventor: Yoshiro Shimojo, Yokkaichi (JP)

(73) Assignee: Toshiba Memory Corporation, Minato-ku (JP)

(*) Notice: Subject to any disclaimer, the term of this patent is extended or adjusted under 35 U.S.C. 154(b) by 290 days.

(21) Appl. No.: 15/070,825

(22) Filed: Mar. 15, 2016

(65) Prior Publication Data

US 2017/0221920 A1  Aug. 3, 2017

Related U.S. Application Data

(60) Provisional application No. 62/289,632, filed on Feb. 1, 2016.

(51) Int. Cl.

| | |
|---|---|
| H01L 29/788 | (2006.01) |
| H01L 27/11582 | (2017.01) |
| G11C 16/04 | (2006.01) |
| G11C 16/26 | (2006.01) |
| G11C 16/08 | (2006.01) |
| H01L 23/528 | (2006.01) |
| H01L 27/11565 | (2017.01) |

(Continued)

(52) U.S. Cl.
CPC .... *H01L 27/11582* (2013.01); *G11C 16/0466* (2013.01); *G11C 16/0483* (2013.01); *G11C 16/08* (2013.01); *G11C 16/26* (2013.01); *H01L 23/528* (2013.01); *H01L 27/1157* (2013.01); *H01L 27/11565* (2013.01); *H01L 27/11573* (2013.01)

(58) Field of Classification Search
CPC ......... H01L 21/28273; H01L 21/28282; H01L 21/764; H01L 21/02532; H01L 21/02595; H01L 21/04; H01L 21/31144; H01L 21/8221
USPC .......................... 257/314, 326, 315, 316, 321
See application file for complete search history.

(56) References Cited

U.S. PATENT DOCUMENTS

| | | | |
|---|---|---|---|
| 2013/0105880 A1* | 5/2013 | Kim | ............... H01L 21/28273 257/316 |
| 2014/0097484 A1 | 4/2014 | Seol et al. | |
| 2014/0187029 A1 | 7/2014 | Seol et al. | |

(Continued)

*Primary Examiner* — Selim U Ahmed
*Assistant Examiner* — Andre Stevenson
(74) *Attorney, Agent, or Firm* — Oblon, McClelland, Maier & Neustadt, L.L.P.

(57) ABSTRACT

A semiconductor memory device according to an embodiment includes: first and second memory columnar bodies aligned in a second direction intersecting a first direction, the first and second memory columnar bodies respectively including a semiconductor layer and extending in the first direction; a bit line disposed above the first and second memory columnar bodies; and a first connecting line disposed between the first and second memory columnar bodies and the bit line in the first direction and electrically coupled to the semiconductor layers of the first and second memory columnar bodies and the bit line, the first connecting line extending linearly in the second direction, and a center line widthwise of the first connecting line being in a position displaced in a third direction, the third direction intersecting the first and second directions, from positions of centers of the first and second memory columnar bodies.

11 Claims, 12 Drawing Sheets

(51) Int. Cl.
*H01L 27/1157* (2017.01)
*H01L 27/11573* (2017.01)

(56) References Cited

U.S. PATENT DOCUMENTS

2014/0284685 A1    9/2014  Shimojo et al.
2018/0175108 A1*   6/2018  Terada .................. H01L 27/249

* cited by examiner

SEMICONDUCTOR MEMORY DEVICE

CROSS-REFERENCE TO RELATED APPLICATIONS

This application is based upon and claims the benefit of priority from the prior U.S. Provisional Application 62/289,632, filed on Feb. 1, 2016, the entire contents of which are incorporated herein by reference.

BACKGROUND

Field

Embodiments of the present invention relate to a semiconductor memory device.

Description of the Related Art

One kind of semiconductor memory device is a flash memory. Of flash memories, in particular, a NAND type flash memory is generally widely used since it is low cost and has a large capacity. Up to now, many technologies for increasing the capacity of this NAND type flash memory have been proposed. One such technology is a structure in which memory cells are disposed three-dimensionally.

DETAILED DESCRIPTION

A semiconductor memory device according to an embodiment includes: first and second memory columnar bodies aligned in a second direction intersecting a first direction, the first and second memory columnar bodies respectively including a semiconductor layer and extending in the first direction; a bit line disposed above the first and second memory columnar bodies; and a first connecting line disposed between the first and second memory columnar bodies and the bit line in the first direction and electrically coupled to the semiconductor layers of the first and second memory columnar bodies and the bit line, the first connecting line extending linearly in the second direction, and a center line widthwise of the first connecting line being in a position displaced in a third direction, the third direction intersecting the first and second directions, from centers of the first and second memory columnar bodies.

Semiconductor memory devices according to embodiments will be described below with reference to the drawings.

First Embodiment

Figure 1:
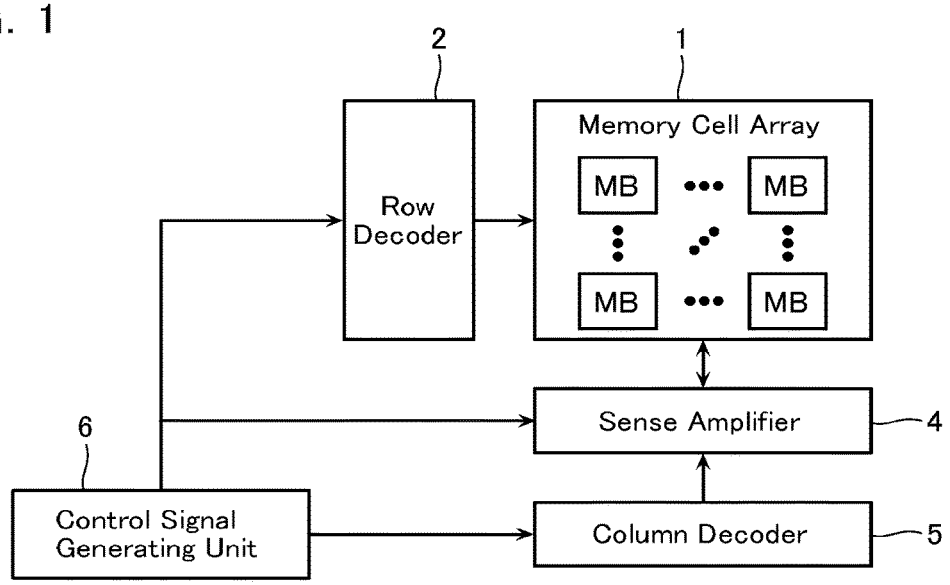
FIG. 1 is a view showing functional blocks of a semiconductor memory device according to a first embodiment.

First, an overall configuration of a semiconductor memory device according to a first embodiment will be described using FIG. 1.

The semiconductor memory device according to the present embodiment includes, a memory cell array 1, a row decoder 2, a sense amplifier 4, a column decoder 5, and a control signal generating unit 6. The memory cell array 1 includes a plurality of memory blocks MB. Each of the memory blocks MB includes a plurality of memory cells (not illustrated in FIG. 1) arranged three-dimensionally therein. The row decoder 2 decodes a downloaded block address signal, and so on, and controls a write operation and a read operation of data on the memory cell. The sense amplifier 4 detects and amplifies an electrical signal flowing in the memory cell during the read operation. The column decoder 5 decodes a column address signal and controls the sense amplifier 4. The control signal generating unit 6, in addition to boosting a reference voltage and generating a high voltage employed in the write operation or an erase operation, generates a control signal and controls the row decoder 2, the sense amplifier 4, and the column decoder 5.

Figure 2:
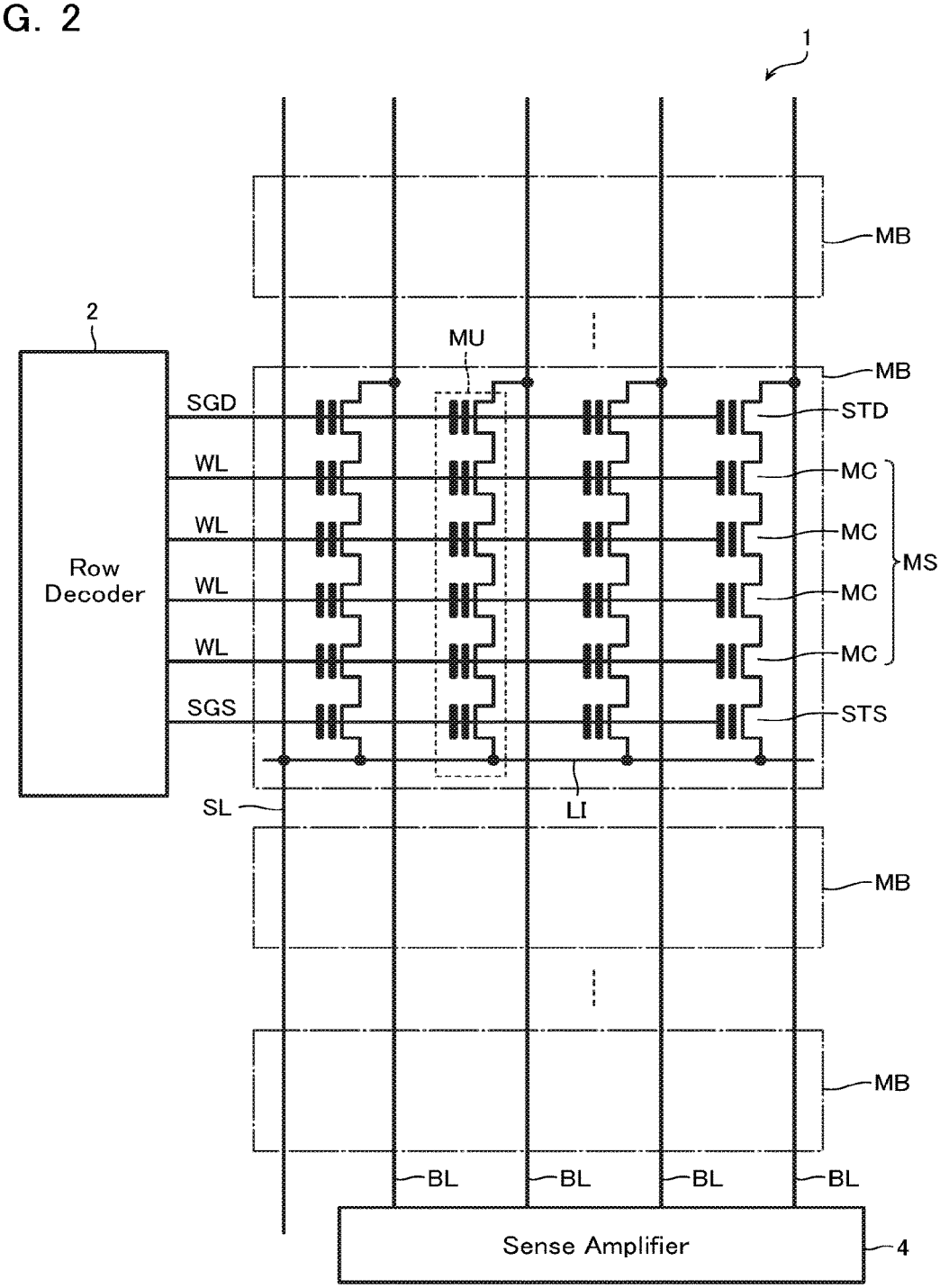
FIG. 2 is an equivalent circuit diagram of a memory cell array of the semiconductor memory device according to the same embodiment.

Next, an equivalent circuit of the memory cell array 1 will be described using FIG. 2.

As previously mentioned, the memory cell array 1 includes the plurality of memory blocks MB. This memory block MB is a unit of the erase operation. Each of the memory blocks MB includes a source line SL, a plurality of bit lines BL electrically coupled to the sense amplifier 4, a source side select gate line SGS, a plurality of word lines WL, and a drain side select gate line SGD that are electrically coupled to the row decoder 2, and a source contact LI electrically coupled to the source line SL. Of these, the source line SL and the plurality of bit lines BL are shared by the plurality of memory blocks MB.

In addition, each of the memory blocks MB includes a plurality of memory units MU that have their one ends connected to the bit line BL and have their other ends connected to the source contact LI. Each of the memory units MU includes a memory string MS, a source side select transistor STS connected between the memory string MS and the source contact LI, and a drain side select transistor STD connected between the memory string MS and the bit line BL. The plurality of memory strings MS each include a plurality of memory cells MC connected in series. Each of the memory cells MC is a transistor having a semiconductor layer, a charge accumulation layer, and a control gate, and stores multiple data by an amount of charge accumulated in the charge accumulation layer. Commonly connected to the control gates of pluralities of the memory cells MC of different memory strings MS are the plurality of word lines WL. The plurality of memory cells MC commonly connected to one word line WL are a unit of the write operation and the read operation called a page. Connected to a control gate of the source side select transistor STS is the source side select gate line SGS. Connected to a control gate of the drain side select transistor STD is the drain side select gate line SGD.

Figure 3:
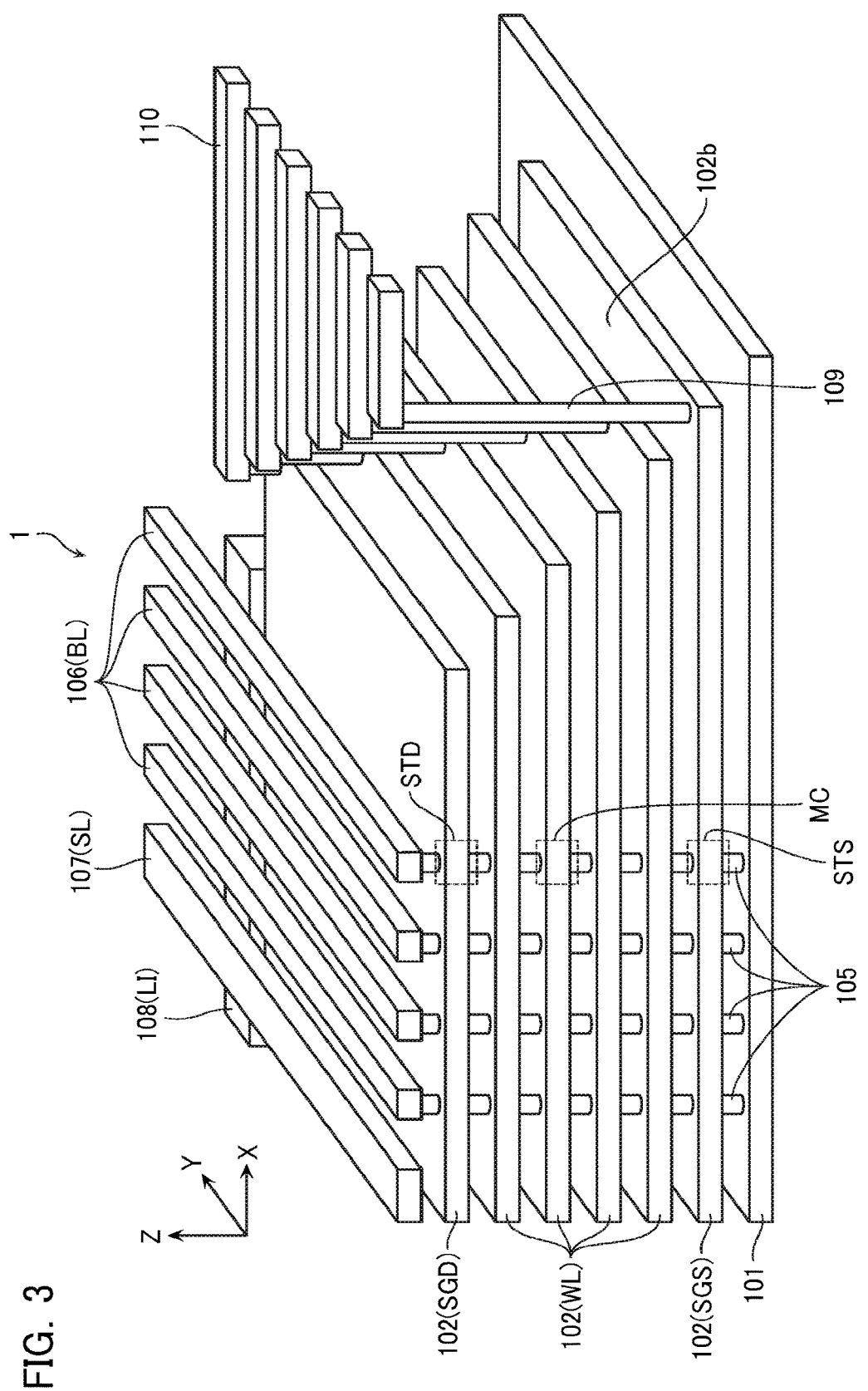
FIG. 3 is a perspective view showing a structure of the memory cell array of the semiconductor memory device according to the same embodiment.

Next, a schematic structure of the memory cell array 1 will be described using FIG. 3.

The memory cell array 1 includes a semiconductor substrate 101, and a plurality of conductive lines 102 stacked in a Z direction (first direction) above the semiconductor substrate 101. The semiconductor substrate 101 is made from silicon (Si), for example. The conductive line 102 is made from, for example, tungsten (W), polysilicon (Poly-Si), or the like. In addition, the memory cell array 1 includes a plurality of memory columnar bodies 105 extending in the Z direction. Intersections of the plurality of conductive lines 102 and the memory columnar body 105 function as the source side select transistor STS, the plurality of memory cells MC, and the drain side select transistor STD. The plurality of conductive lines 102 function as the source side select gate line SGS, the word line WL, and the drain side select gate line SGD.

The plurality of conductive lines 102 have their ends formed in steps. That is, a certain conductive line 102 has a contact portion 102b that does not face a bottom surface of another conductive line 102 positioned in a layer above. The conductive line 102 is connected to a via 109 at this contact portion 102b. The via 109 is connected at its upper end to a wiring line 110. The via 109 and the wiring line 110 are made from tungsten (W), for example.

In addition, the memory cell array 1 includes a source contact 108 that faces side surfaces in a Y direction (second direction) of the plurality of conductive lines 102 and extends in an X direction (third direction). The source contact 108 is connected at its bottom surface to the semiconductor substrate 101. The source contact 108 is formed from the tungsten (W), for example, and functions as the source contact LI.

Moreover, the memory cell array 1 includes a plurality of bit lines 106 and a source line 107 that are arranged with a certain pitch in the X direction and extend in the Y direction above the plurality of conductive lines 102 and the memory columnar body 105. The bit line 106 is electrically coupled at its bottom surface to the memory columnar body 105. The bit line 106 is made from copper (Cu), for example, and functions as the bit line BL. The source line 107 is electrically coupled at its bottom surface to the source contact 108. The source line 107 is made from, for example, copper (Cu), and functions as the source line SL.

Figure 4:
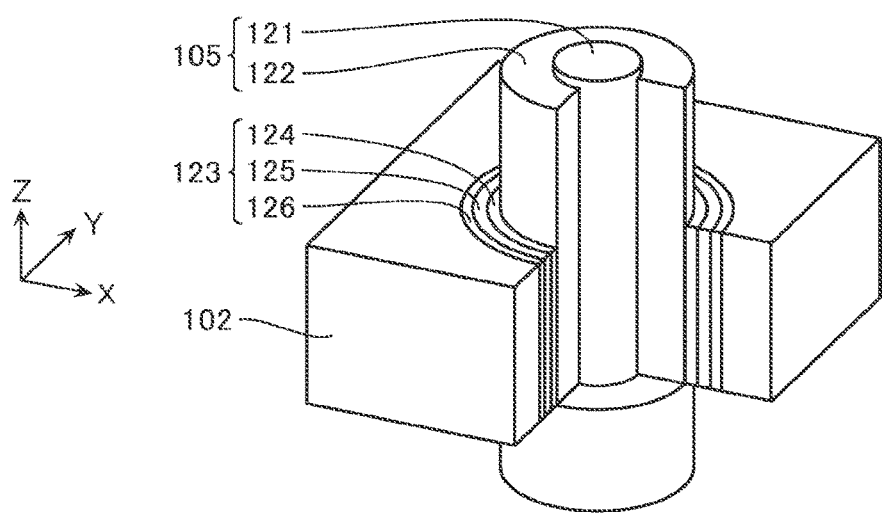
FIG. 4 is a perspective view showing a structure of a memory columnar body and a periphery thereof, of the memory cell array of the semiconductor memory device according to the same embodiment.

Next, a schematic structure of the memory cell MC will be described using FIG. 4. Note that a similar structure to that of FIG. 4 may be adopted also for the source side select transistor STS and the drain side select transistor STD.

As previously mentioned, the memory cell MC is formed at an intersection of the conductive line 102 and the memory columnar body 105. The memory columnar body 105 includes a core insulating layer 121, and a semiconductor layer 122 that covers a side surface of the core insulating layer 121. Of these, the semiconductor layer 122 is electrically coupled to the bit line BL shown in FIG. 3. Moreover, the memory cell array 1 includes a multi-film layer 123 disposed at an intersection of the conductive line 102 and the semiconductor layer 122. The multi-film layer 123 includes the following, deposited from the semiconductor layer 122 to the conductive line 102, namely a tunnel insulating layer 124, a charge accumulation layer 125, and a block insulating layer 126.

The core insulating layer 121 is made from silicon oxide ($SiO_2$), for example. The semiconductor layer 122 is made from polysilicon (Poly-Si), for example, and functions as a channel of the memory cell MC, the source side select transistor STS, and the drain side select transistor STD. The tunnel insulating layer 124 is made from silicon oxide ($SiO_2$), for example. The charge accumulation layer 125 is made from a material capable of charge accumulation, such as silicon nitride (SiN), for example. The block insulating layer 126 is made from silicon oxide ($SiO_2$), for example.

Note that the memory columnar body 105 may include part or all of a configuration of the multi-film layer 123. Moreover, the multi-film layer 123 may include a block high-permittivity layer and a barrier layer between the block insulating layer 126 and the conductive line 102. In this case, the block high-permittivity layer is made from, for example, a metal oxide such as alumina ($Al_2O_3$), hafnium oxide ($HfO_x$), or the like. The barrier layer is made from, for example, a metal nitride such as titanium nitride (TiN), tungsten nitride (WN), tantalum nitride (TaN), or the like.

Figure 5:
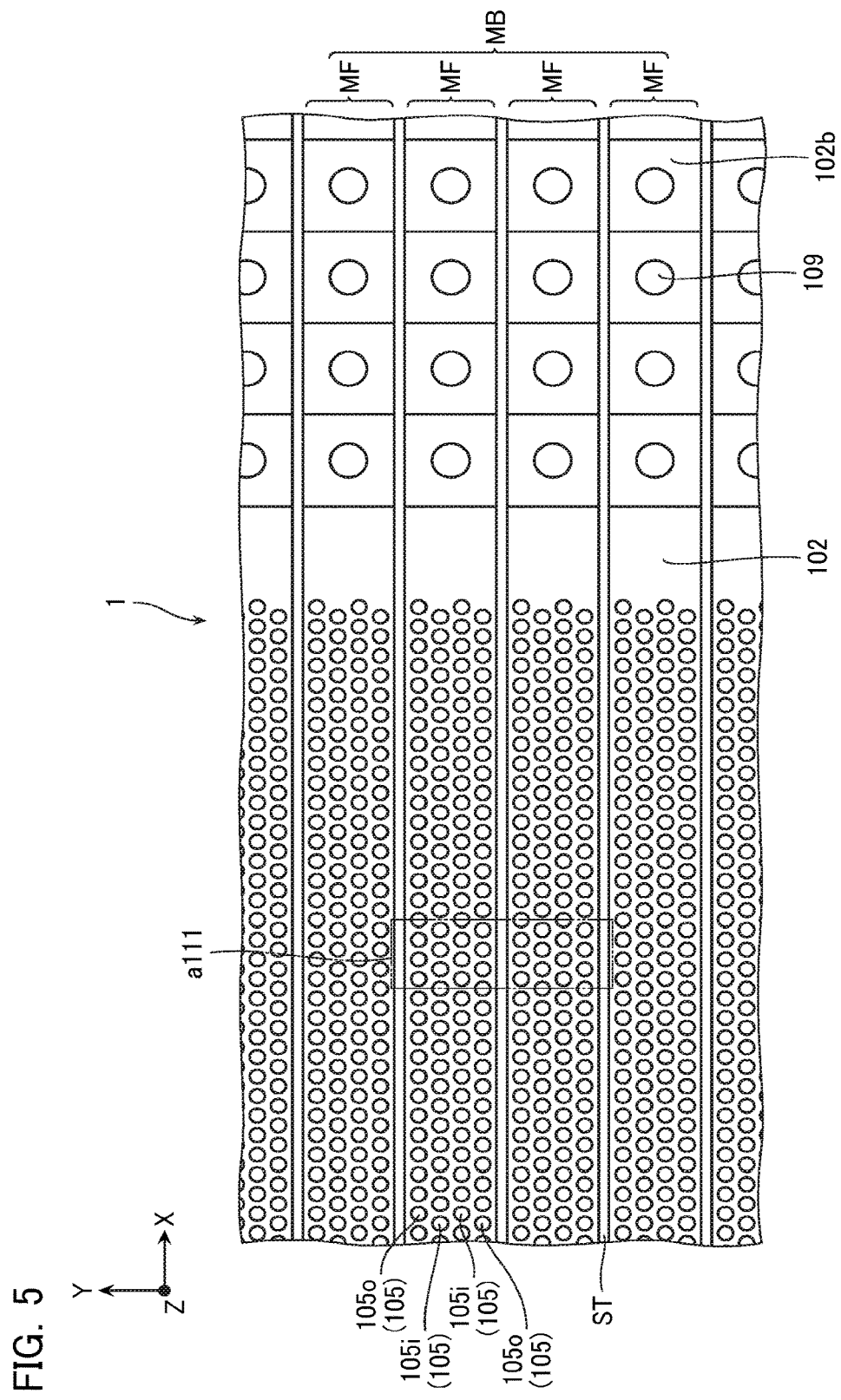
FIG. 5 is a plan view showing a layout of the memory cell array of the semiconductor memory device according to the same embodiment.

Next, a layout of the memory cell array 1 will be described using FIG. 5.

As previously mentioned, the memory cell array 1 has the plurality of conductive lines 102 stacked in the Z direction therein, and each of the conductive lines 102 has at its end the contact portion 102b contacting the via 109. In addition, the memory cell array 1 has formed therein an element isolation trench ST having the Z direction as its depth direction and the X direction as its extension direction, whereby each of the conductive lines 102 is also divided in the Y direction by the element isolation trench ST. Hereafter, a portion sandwiched by two element isolation trenches ST will sometimes also be referred to as a "memory finger MF". A plurality of the memory fingers MF (in the case of FIG. 5, four memory fingers MF) configure the memory block MB. Vias 109 disposed in the same layer within the same memory block MB are commonly connected by an unillustrated wiring line, whereby word lines WL disposed in the same layer within the same memory block MB are short-circuited. Note that the source contact 108 (LI) shown in FIG. 3 is disposed in this element isolation trench ST. An unillustrated insulating layer is formed between this source contact 108 and both side surfaces along the X direction of the element isolation trench ST, whereby the source contact 108 is electrically insulated from the conductive line 102.

The plurality of memory columnar bodies 105 are arranged in a staggered lattice shape when viewed from the Z direction. One memory finger MF has, for example, four columns of memory columnar bodies 105 arranged in the Y direction therein. For distinction, hereafter, of the four columns of memory columnar bodies 105 sandwiched by the element isolation trenches ST, the two columns of memory columnar bodies 105 disposed on the outside close to the element isolation trenches ST are sometimes also assumed to be "outer memory columnar bodies 1050" (first memory columnar bodies), and the two columns of memory columnar bodies 105 disposed on the inside far from the element isolation trenches ST are sometimes also assumed to be "inner memory columnar bodies 105*i*" (second memory columnar bodies). Note that in FIG. 5, the memory columnar bodies 105 are arranged in a staggered lattice shape, but the present embodiment is not limited to this, and they may also be arranged in an orthogonal lattice shape, for example.

Figure 6:
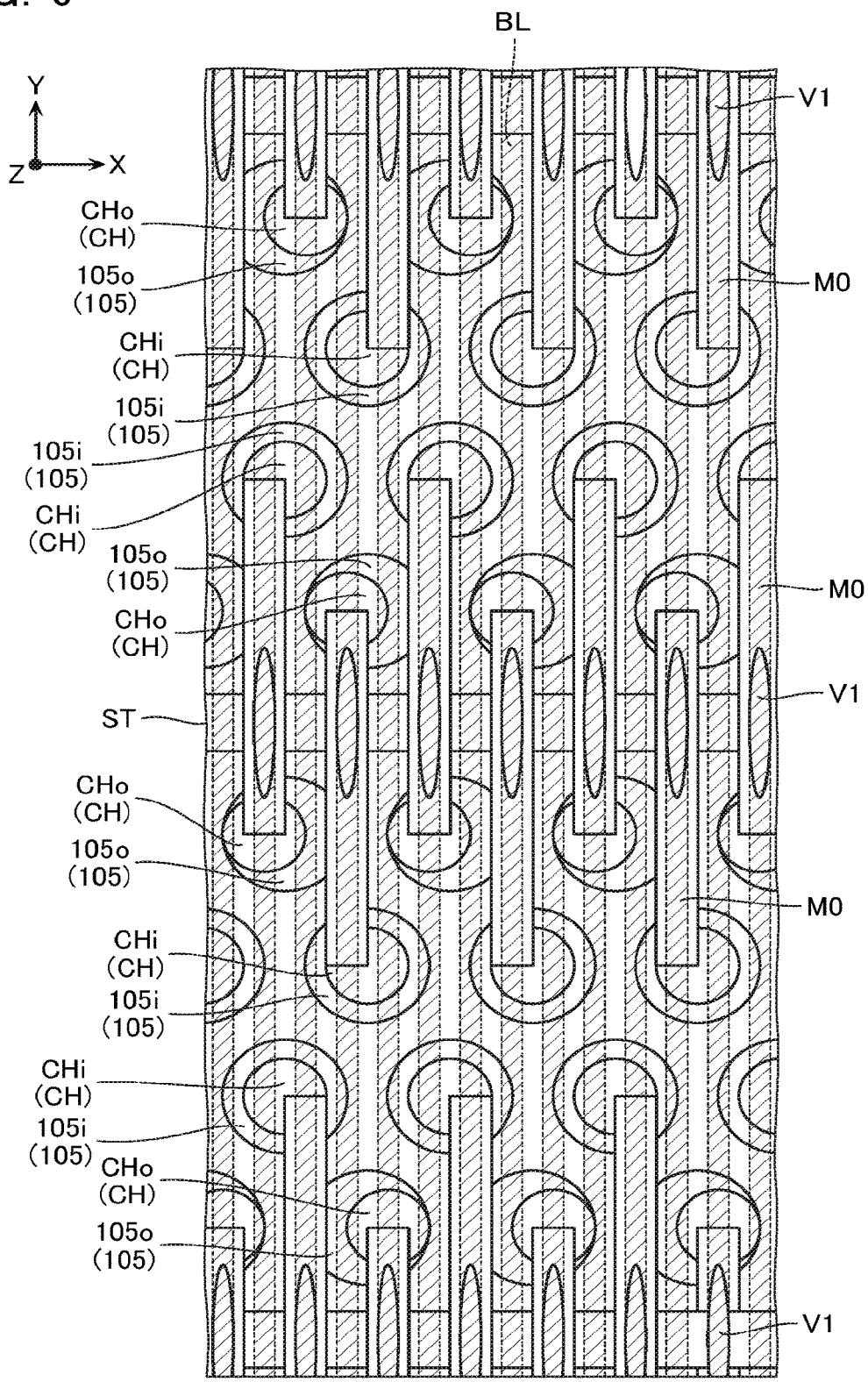
FIG. 6 is a plan view showing a layout of the memory columnar body, a bit line, and a connecting line and connecting portion, of the semiconductor memory device according to the same embodiment.
Figure 7:
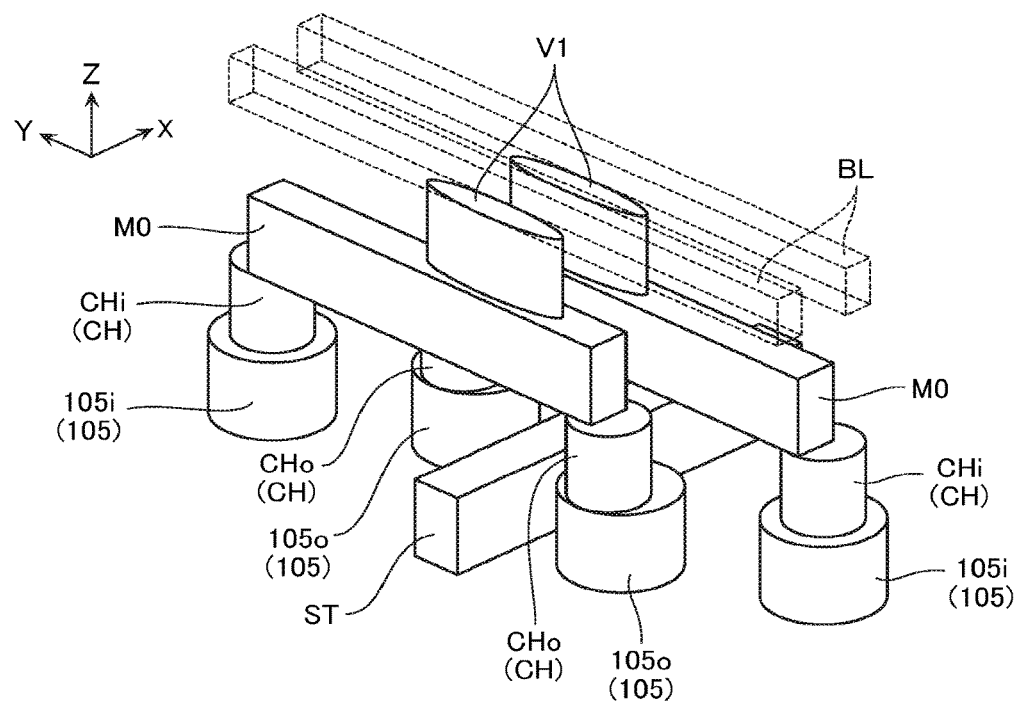
FIG. 7 is a perspective view showing a structure of the connecting line and the connecting portion of the semiconductor memory device according to the same embodiment.

Next, a connecting structure of the semiconductor layer 122 of the memory columnar body 105 and the bit line BL, according to the semiconductor memory device of the first embodiment, will be described using FIGS. 6 and 7. FIG. 6 corresponds to the region a111 surrounded by a dot-chain line shown in FIG. 5. Moreover, in order to make a structure between the memory columnar body 105 and the bit line BL easily seen, FIGS. 6 and 7 show the bit line BL transparently.

The memory columnar body 105 and the bit line BL are electrically coupled via a connecting portion CH (first and second connecting portions), a connecting line M0, and a connecting portion V1 (third connecting portion).

The plurality of bit lines BL are arranged in the X direction in a line-and-space (hereafter, indicated simply as "L/S") pattern of a certain pitch. Each of the bit lines BL extends in the Y direction.

One connecting portion CH is disposed for every one memory columnar body 105. Each of the connecting portions CH is formed in a columnar shape having the Z direction as its axial direction, and is disposed in an arrangement region of the memory columnar body 105 when viewed from the Z direction. Each of the connecting portions CH is electrically coupled at its bottom surface to the semiconductor layer 122 shown in FIG. 4 of the memory columnar body 105. For distinction, hereafter, the connecting portion CH contacting the outer memory columnar body 105*o* will be assumed to be an "outer connecting portion CHo", and the connecting portion CH contacting the inner memory columnar body 105*i* will be assumed to be an "inner connecting portion CHi".

Each of the connecting lines M0 is formed linearly along the Y direction, and contacts, at both ends of its bottom surface, upper surfaces of two connecting portions CH aligned in the Y direction sandwiching the element isolation trench ST. Due to each of the connecting lines M0, the semiconductor layers 122 of the outer memory columnar body 105*o* and the inner memory columnar body 105*i* aligned in the Y direction sandwiching the element isolation trench ST, are electrically coupled.

At least one connecting portion V1 is disposed for every one connecting line M0, in other words, for every two memory columnar bodies 105. Each of the connecting portions V1 is formed in an elliptical column shape having an X-Y cross-section of elliptical shape with minor axis direction in the X direction and major axis direction in the Y direction, and having the Z direction as its axial direction. Each of the connecting portions V1 contacts, at its bottom surface, an upper surface of the connecting line M0, and contacts, at its upper surface, the bit line BL. Note that in the example of FIG. 6, the connecting portion V1 is disposed at a position overlapping the element isolation trench ST in the Y direction and at the same position in the Y direction as other connecting portions V1 aligned in the X direction, but the present embodiment is not limited to this, and the contact V1 may be disposed at any position provided that that position is within an arrangement region of the connecting line M0 to be contacted.

However, when a center of the memory columnar body 105 and a center of the bit line BL electrically coupled thereto are displaced in the X direction as in the present embodiment, ingenuity becomes required in arrangement of the connecting line M0 and connecting portions CH and V1 connecting these memory columnar body 105 and bit line BL.

Figure 10:
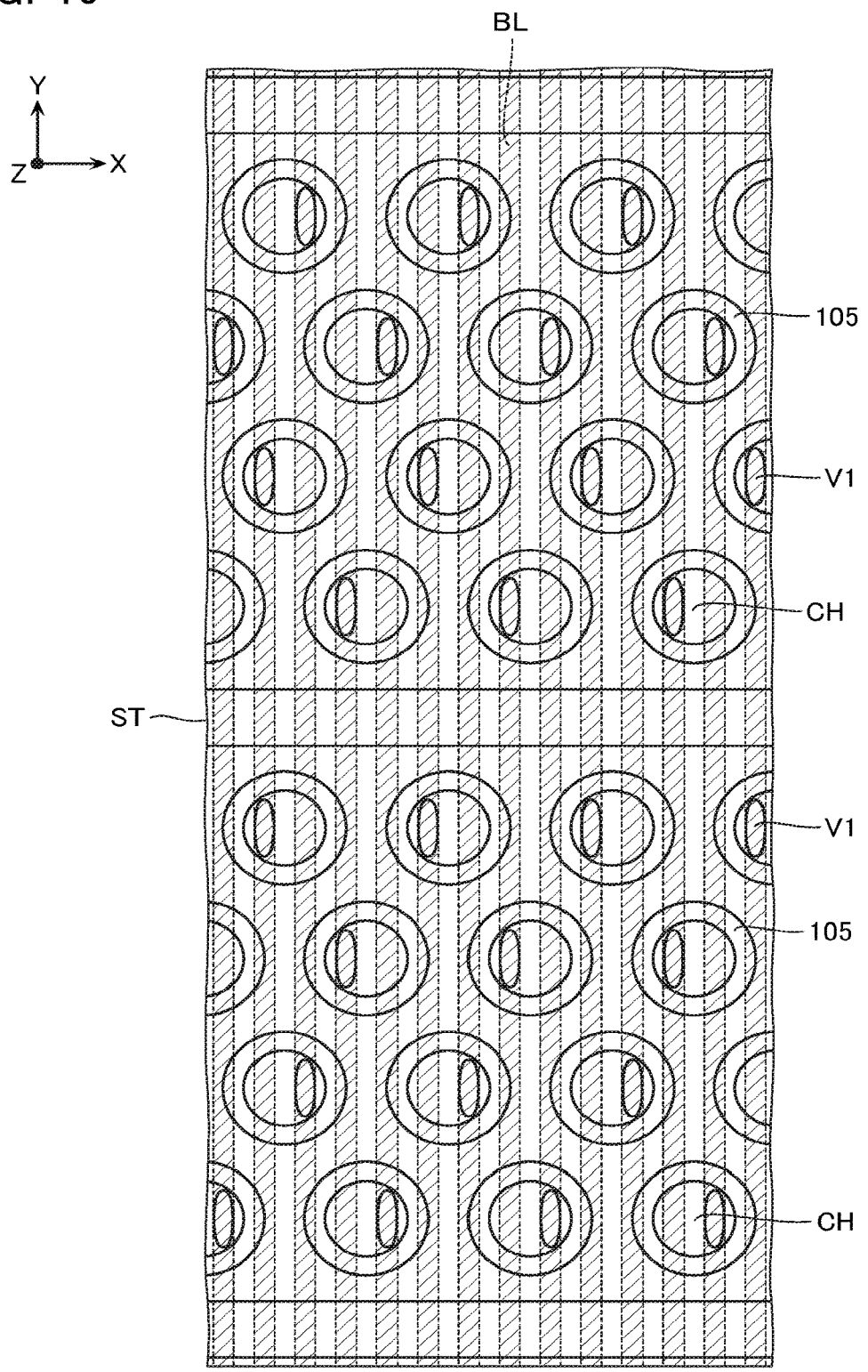
FIG. 10 is a plan view showing a layout of a memory columnar body, a bit line, and a connecting portion, of a semiconductor memory device according to a first comparative example.

Accordingly, conceivable is a layout of connecting lines and connecting portions of a first comparative example shown in FIG. 10. In the first comparative example, contrary to in the present embodiment, there is no configuration corresponding to the connecting line M0, and the connecting portion CH and connecting portion V1 contact directly one-to-one. In the first comparative example, the connecting portion V1 is disposed such that, in the X direction, its center matches a center of the bit line BL displaced from a center of the memory columnar body 105 (or connecting portion CH), whereby misalignment in the X direction of the memory columnar body 105 and the connecting portion V1 is resolved. In this case, one connecting portion V1 ends up being required for every one memory columnar body 105. Moreover, the connecting portion V1 must be disposed within the arrangement region of the connecting line M0, and to that extent, a length in the Y direction (major axis) of the connecting portion V1 cannot be sufficiently taken. Therefore, lithography during formation of the connecting portion V1 becomes difficult.

Figure 11:
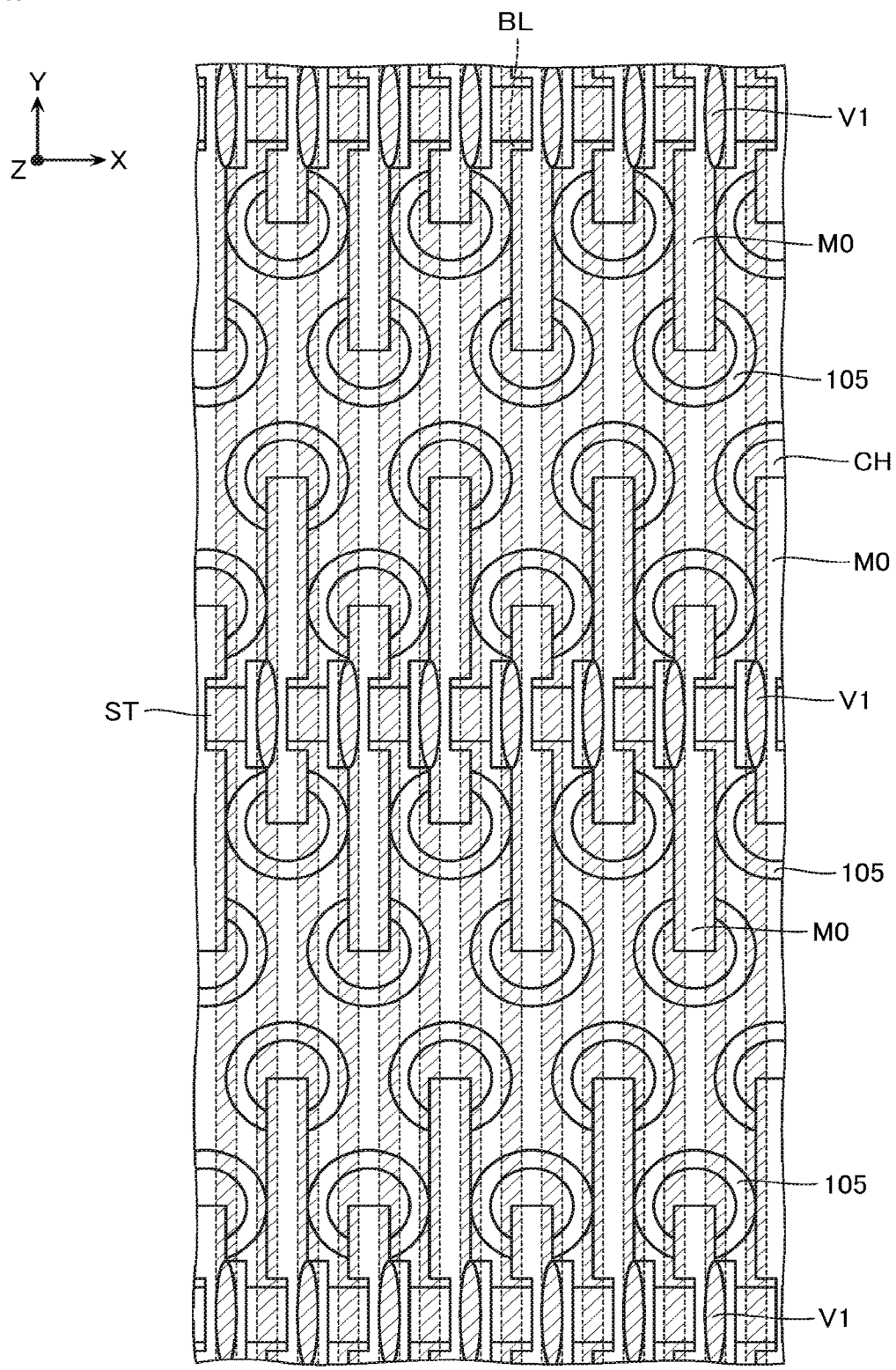
FIG. 11 is a plan view showing a layout of a memory columnar body, a bit line, a connecting line, and a connecting portion, of a semiconductor memory device according to a second comparative example.

Next conceivable is a layout of connecting lines and connecting portions of a second comparative example shown in FIG. 11. In the second comparative example, similarly to in the present embodiment, two memory columnar bodies 105 aligned in the Y direction sandwiching the element isolation trench ST are electrically coupled by the connecting line M0. In the second comparative example, the connecting line M0 has its intermediate portion configured in a bent shape passing through the arrangement region of the bit line BL, whereby misalignment in the X direction of the memory columnar body 105 and the bit line BL is resolved. In this case, the connecting portion V1 need only be disposed for every one connecting line M0, hence the number of connecting portions V1 can be reduced by half compared to in the first comparative example. Moreover, the connecting portion V1 can be disposed within the arrangement region of the connecting line M0, hence the length in the Y direction (major axis) of the connecting portion V1 can be taken in larger measure compared to the connecting portion V1 of the first comparative example which is required to be kept within an arrangement region of the connecting portion CH. Therefore, lithography during formation of the connecting portion V1 becomes somewhat easy.

However, in the case of the second comparative example, as previously mentioned, a shape of the connecting line M0 becomes irregular, hence lithography during formation of the connecting line M0 becomes difficult. Therefore, in some cases, a common exposure margin between the connecting line M0 and various kinds of wiring lines (not illustrated) disposed in a peripheral circuit cannot be sufficiently secured, resulting in a need for lithography during formation of these to be performed divided into two times. In this case, manufacturing costs naturally increase.

Accordingly, in the present embodiment, as shown in FIG. 6, the linear connecting line M0 extending in the Y direction is disposed such that, in the X direction, its center matches the center of the bit line BL displaced from the center of the memory columnar body 105, whereby misalignment in the X direction of the memory columnar body 105 and the bit line BL is resolved.

In this case, contact between the outer connecting portion CHo and the connecting line M0 adjacent in the X direction to this outer connecting portion CHo, becomes a problem. In the present embodiment, this problem is avoided by disposing the connecting portion CHo displaced at a position where it does not contact the adjacent connecting line M0 within the arrangement region of the outer memory columnar body 105o. In the case of FIG. 5, centers of the connecting portion CHo and the connecting line M0 contacting this connecting portion CHo are in the same position in the X direction. Moreover, since only the connecting portion CHo is displaced in the X direction, centers of the connecting portion CHo and the connecting portion CHi contacting the same connecting line M0 are in different positions in the X direction. As a result, centers of the connecting portion CHi and the connecting line M0 contacting this connecting portion CHi are in different positions in the X direction.

Next, superiority in terms of lithography of the present embodiment with respect to the second comparative example will be described using a more specific example of the memory cell array 1.

Figure 8:
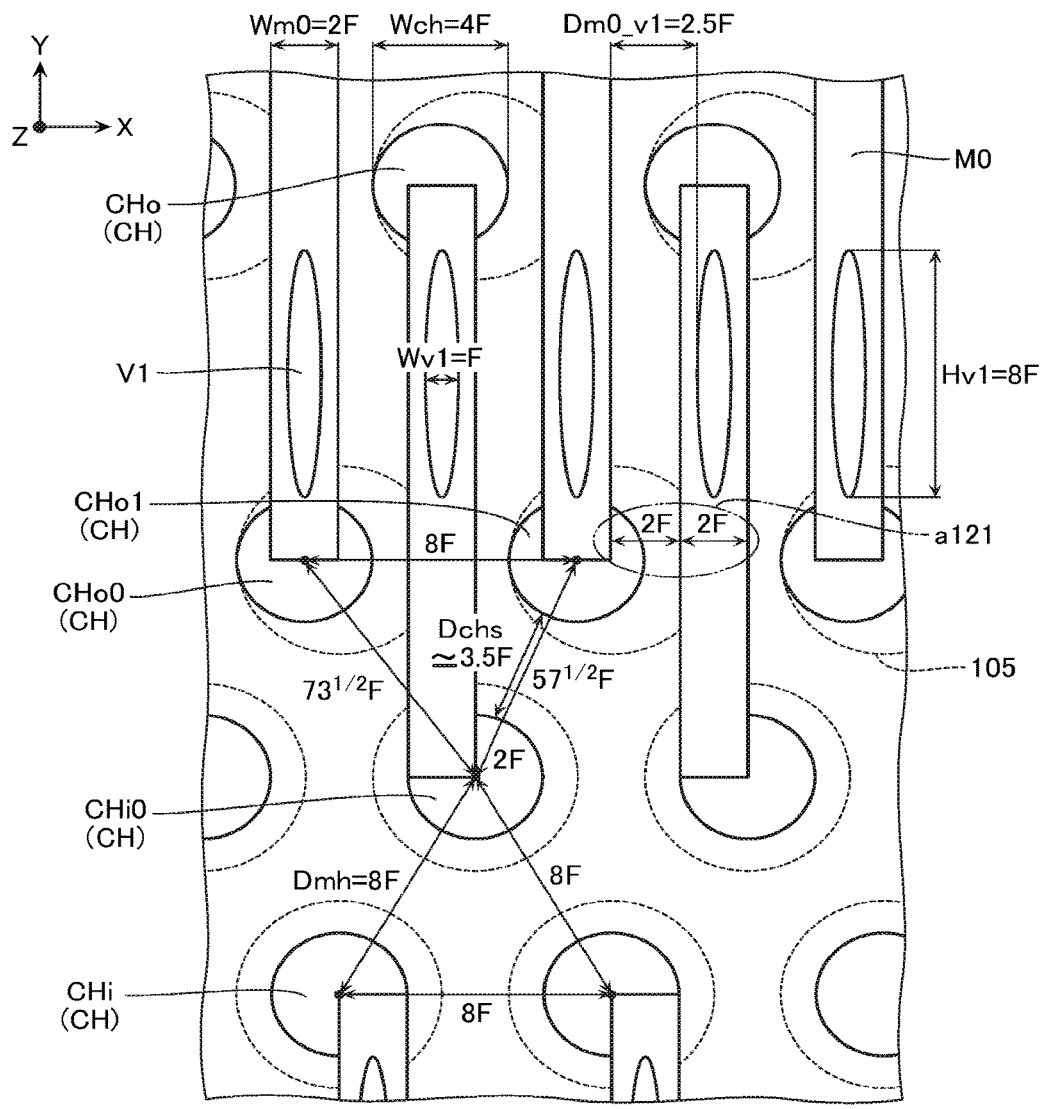
FIG. 8 is a plan view showing various kinds of dimensions related to the connecting line and the connecting portion of the semiconductor memory device according to the same embodiment.
Figure 12:
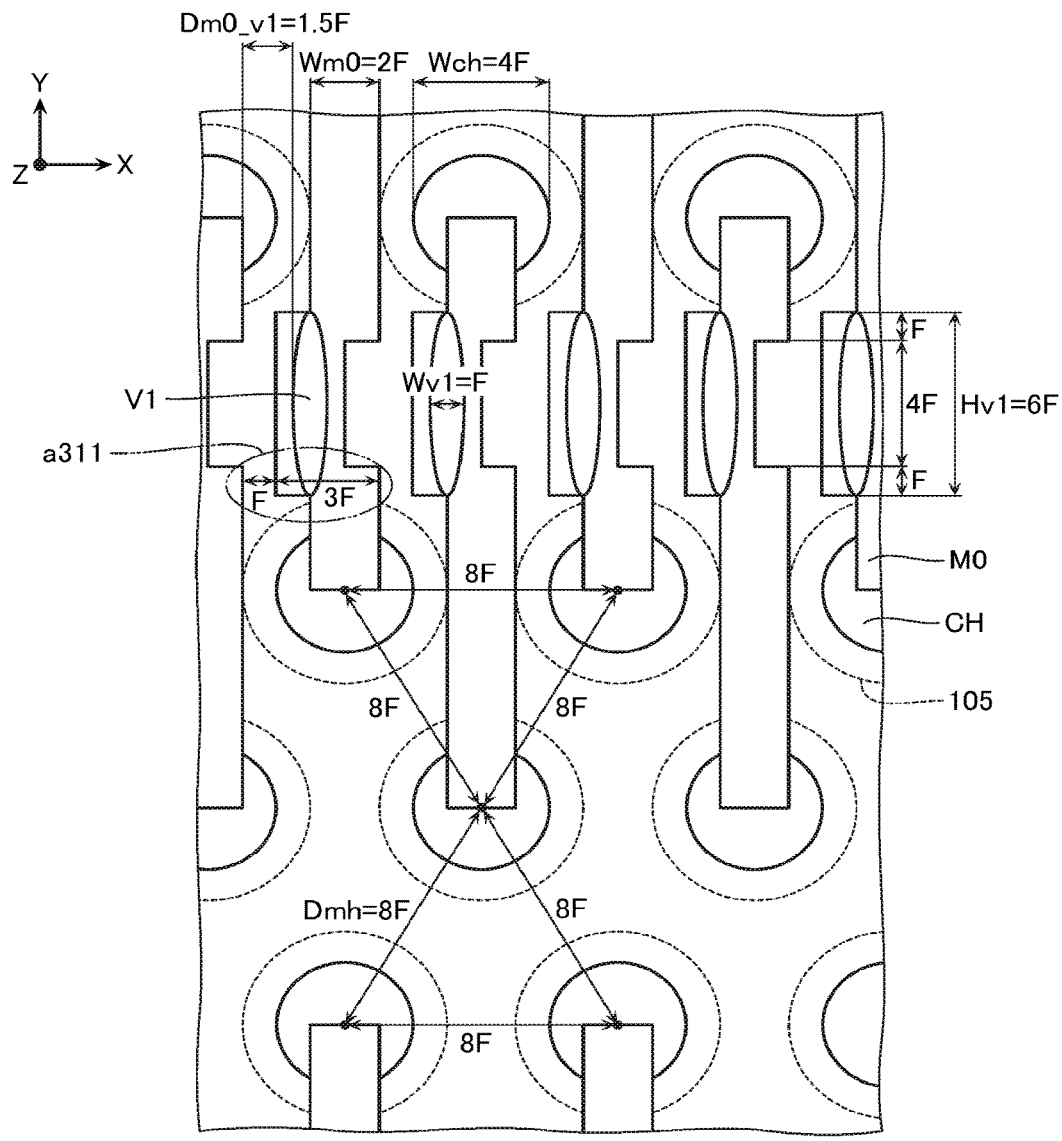
FIG. 12 is a plan view showing various kinds of dimensions related to the connecting line and the connecting portion of the semiconductor memory device according to the same comparative example.

FIGS. 8 and 12 are plan views showing various kinds of dimensions related to the connecting line and the connecting portion of the semiconductor memory devices according to the present embodiment and the second comparative example. Now, FIGS. 8 and 12 are both examples in which a plurality of the memory columnar bodies 105 are arranged in a staggered lattice shape when viewed from the Z direction, and the plurality of memory columnar bodies 105 are arranged such that when centers of three of the memory columnar bodies 105 closely adjacent to each other are joined, an equilateral triangle having lengths of each of its sides (distances between centers of the memory columnar bodies 105) all being Dmh=8F (F is a minimum processing dimension, and when F=19.5 nm, Dmh=156 nm), is configured. In addition, it is configured that a diameter of the connecting portion CH is Wch=4F, a width in the X direction of the connecting line M0 is Wm0=2F, and a maximum width in the X direction of the connecting portion V1 is Wv1=F.

In the second comparative example, as shown in FIG. 12, dimension management of a bent place of the connecting line M0 is difficult, hence as shown by a311 in FIG. 12, the result is an uneven pattern where L/S=F/3F in that place. In this regard, in the present embodiment, as shown in FIG. 8, there is no bent place in the connecting line M0, hence as shown by a121 in FIG. 8, the connecting line M0 can be formed with a pattern of L/S=2F/2F. Moreover, regarding distance between the connecting line M0 and the connecting portion V1, in the second comparative example, as shown in FIG. 12, only Dm0_v1=1.5F can be secured, whereas in the present embodiment, as shown in FIG. 8, as much as Dm0_v1=2.5F can be secured. Therefore, in the case of the present embodiment, not only does lithography during formation of the connecting line M0 become easier, but also a more sufficient margin with respect to misalignment of the connecting line M0 and the connecting portion V1 can be secured, compared to in the second comparative example. As a result, a common exposure margin between the connecting line M0 and various kinds of wiring lines of a peripheral circuit can be sufficiently secured, hence, contrary to in the second comparative example, the connecting line M0 and the various kinds of wiring lines of the peripheral circuit can be formed in one time of lithography.

Furthermore, regarding the length in the Y direction (major axis) of the connecting portion V1, in the second comparative example, as shown in FIG. 12, Hv1=6F is a limit, whereas in the present embodiment, as shown in FIG. 8, it can be extended to about Hv1=8F, even when the plurality of connecting portions V1 adjacent in the X direction are disposed aligned in the same position in the Y direction. Therefore, in the case of the present embodiment, lithography during formation of the connecting portion V1 is easier compared to in the second comparative example.

Note that in the case of the present embodiment, by having the outer connecting portion CHo disposed displaced from the center of the outer memory columnar body 105o in the X direction, for example, a geometric shape joining centers of closely adjacent connecting portions CHo0, CHo1, and CHi0 is a distorted triangle (in the case of FIG. 8, a triangle whose lengths of each of its sides are 8F, $57^{1/2}$F, and $73^{1/2}$F), hence regularity of the layout gets somewhat spoiled compared to in the second comparative example. However, Dchs=approximately 3.5F (=$57^{1/2}$F−4F) can be secured even between the closest CHo1 and CHi0 of the three connecting portions CHo0, CHo1, and CHi0, hence there is no problem since a sufficient exposure margin is secured even during formation of the connecting portion CH.

From the above, the present embodiment makes it possible to provide a semiconductor memory device in which formation of the connecting lines and connecting portions is easy and which is capable of having its manufacturing costs reduced.

Second Embodiment

A second embodiment will be described using FIG. 9.

A layout of a memory cell array 1 of the present embodiment is similar to that of the first embodiment, excluding an arrangement of the inner connecting portion CHi.

Figure 9:
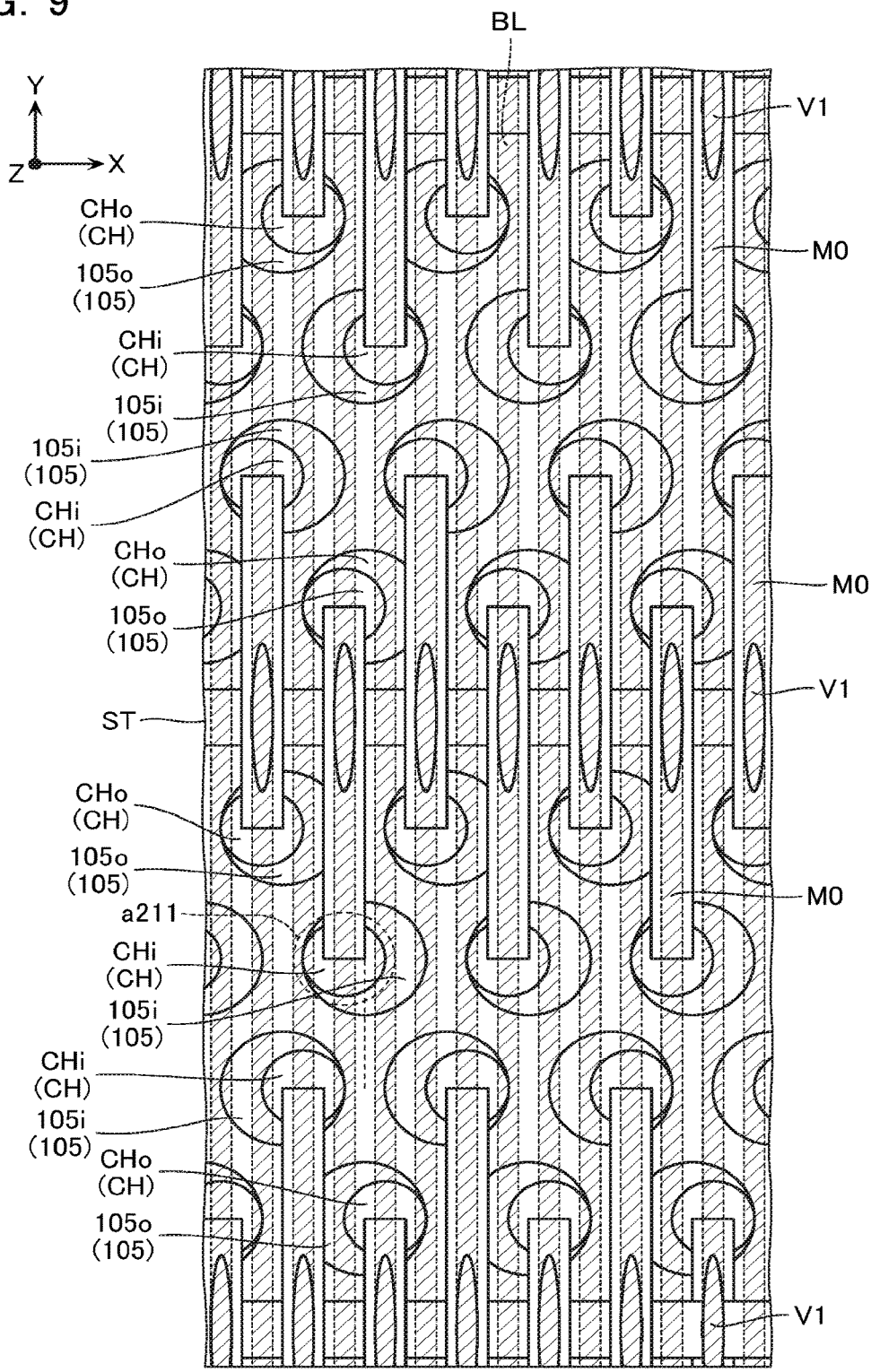
FIG. 9 is a plan view showing a layout of a memory columnar body, a bit line, and a connecting line and connecting portion, of a semiconductor memory device according to a second embodiment.

In the second embodiment, as shown in a211 in FIG. 9, not only the outer connecting portion CHo, but also the inner connecting portion CHi is matched to the outer connecting portion CHo and disposed displaced in the X direction from the center of the inner memory columnar body 105i. As a result, in the case of the present embodiment, contrary to in the first embodiment, centers of the connecting portion CHo and the connecting portion CHi contacting the same connecting line M0 are in the same position in the X direction. Even in this case, similarly to in the first embodiment, the linear connecting line M0 along the Y direction can be disposed directly below the bit line BL.

From the above, the present embodiment also makes it possible to provide a semiconductor memory device in which formation of the connecting lines and connecting portions is easy and which is capable of having its manufacturing costs reduced, similarly to the first embodiment.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate extending in a second direction and a third direction;
first and second memory columnar bodies disposed above the semiconductor substrate in a first direction and aligned in the second direction, the first direction intersecting the second and third directions, the first and second memory columnar bodies respectively including a semiconductor layer and extending in the first direction;
a bit line disposed above the first and second memory columnar bodies in the first direction;
a first connecting line disposed between the first and second memory columnar bodies and the bit line in the first direction and electrically coupled to the semiconductor layers of the first and second memory columnar bodies and the bit line;
a first connecting portion disposed between the first memory columnar body and the first connecting line in the first direction and electrically coupled to the semiconductor layer of the first memory columnar body and the first connecting line; and
a second connecting portion disposed between the second memory columnar body and the first connecting line in the first direction and electrically coupled to the semiconductor layer of the second memory columnar body and the first connecting line, wherein
the first connecting line extends linearly in the second direction, and a center line widthwise of the first connecting line is in a position displaced in the third direction, the third direction intersecting the first and second directions, from positions of centers of the first and second memory columnar bodies, and
a center of the first connecting portion is in a position displaced in the third direction from the center of the first memory columnar body.

2. The semiconductor memory device according to claim 1, wherein centers of the first and second connecting portions have the same position in the third direction.

3. The semiconductor memory device according to claim 1, wherein the center line widthwise of the first connecting line and the center of the first connecting portion have the same position in the third direction.

4. The semiconductor memory device according to claim 1, further comprising: a third connecting portion disposed between the first connecting line and the bit line in the first direction and electrically coupled to the first connecting line and the bit line.

5. The semiconductor memory device according to claim 4, comprising
a plurality of sets of the first and second memory columnar bodies, the first connecting line, and the third connecting portion,
wherein centers of the plurality of third connecting portions have the same position in the second direction.

6. The semiconductor memory device according to claim 5, wherein the plurality of memory columnar bodies are arranged in a staggered lattice shape when viewed from the first direction.

7. A semiconductor memory device, comprising:
a semiconductor substrate extending in a second direction and a third direction;
first and second memory columnar bodies disposed above the semiconductor substrate in a first direction and aligned in the second direction, the first direction intersecting the second and third directions, the first and second memory columnar bodies respectively including a semiconductor layer and extending in the first direction;
a bit line disposed above the first and second memory columnar bodies in the first direction;
a first connecting line disposed between the first and second memory columnar bodies and the bit line in the first direction and electrically coupled to the semiconductor layers of the first and second memory columnar bodies and the bit line;
a first connecting portion disposed between the first memory columnar body and the first connecting line in the first direction and electrically coupled to the semiconductor layer of the first memory columnar body and the first connecting line; and
a second connecting portion disposed between the second memory columnar body and the first connecting line in the first direction and electrically coupled to the semiconductor layer of the second memory columnar body and the first connecting line, wherein
the first connecting line extends linearly in the second direction, and a center line widthwise of the first connecting line is in a position displaced in the third direction, the third direction intersecting the first and second directions, from positions of centers of the first and second memory columnar bodies, and
centers of the first and second connecting portions are in different positions in the third direction.

8. The semiconductor memory device according to claim 7, wherein the center line widthwise of the first connecting line and the center of the second connecting portion are in different positions in the third direction.

9. The semiconductor memory device according to claim 7, further comprising: a third connecting portion disposed between the first connecting line and the bit line in the first direction and electrically coupled to the first connecting line and the bit line.

10. The semiconductor memory device according to claim 9, comprising a plurality of sets of the first and second memory columnar bodies, the first connecting line, and the third connecting portion,
wherein centers of the plurality of third connecting portions have the same position in the second direction.

11. The semiconductor memory device according to claim 10, wherein the plurality of memory columnar bodies are arranged in a staggered lattice shape when viewed from the first direction.

* * * * *